US009384088B1

(12) United States Patent
Jones et al.

(10) Patent No.: US 9,384,088 B1
(45) Date of Patent: Jul. 5, 2016

(54) DOUBLE WRITING MAP TABLE ENTRIES IN A DATA STORAGE SYSTEM TO GUARD AGAINST SILENT CORRUPTION

(71) Applicant: Western Digital Technologies, Inc., Irvine, CA (US)

(72) Inventors: Justin Jones, Burlingame, CA (US); Andrew J. Tomlin, San Jose, CA (US); Rodney N. Mullendore, San Jose, CA (US)

(73) Assignees: Western Digital Technologies, Inc., Irvine, CA (US); Skyera, LLC, San Jose, CA (US)

( * ) Notice: Subject to any disclaimer, the term of this patent is extended or adjusted under 35 U.S.C. 154(b) by 14 days.

(21) Appl. No.: 14/250,212

(22) Filed: Apr. 10, 2014

Related U.S. Application Data

(60) Provisional application No. 61/943,780, filed on Feb. 24, 2014.

(51) Int. Cl.
*G11C 29/00* (2006.01)
*G06F 11/10* (2006.01)
*G11C 29/52* (2006.01)

(52) U.S. Cl.
CPC ........ *G06F 11/1016* (2013.01); *G06F 11/1068* (2013.01); *G11C 29/52* (2013.01)

(58) Field of Classification Search
None
See application file for complete search history.

(56) References Cited

U.S. PATENT DOCUMENTS 6,000,006 A * 12/1999 Bruce ................. G06F 11/1068
711/103
6,856,556 B1 2/2005 Hajeck
7,126,857 B2 10/2006 Hajeck
7,430,136 B2 9/2008 Merry, Jr. et al.
7,447,807 B1 11/2008 Merry et al.
7,502,256 B2 3/2009 Merry, Jr. et al.
7,509,441 B1 3/2009 Merry et al.
7,596,643 B2 9/2009 Merry, Jr. et al.
7,653,778 B2 1/2010 Merry, Jr. et al.
7,685,337 B2 3/2010 Merry, Jr. et al.
7,685,338 B2 3/2010 Merry, Jr. et al.
7,685,374 B2 3/2010 Diggs et al.
7,733,712 B1 6/2010 Walston et al.
7,765,373 B1 7/2010 Merry et al.
7,898,855 B2 3/2011 Merry, Jr. et al.
7,912,991 B1 3/2011 Merry et al.
7,936,603 B2 5/2011 Merry, Jr. et al.
7,962,792 B2 6/2011 Diggs et al.
8,078,918 B2 12/2011 Diggs et al.
8,090,899 B1 1/2012 Syu
8,095,851 B2 1/2012 Diggs et al.
8,108,692 B1 1/2012 Merry et al.
8,122,185 B2 2/2012 Merry, Jr. et al.

(Continued)

*Primary Examiner* — Daniel McMahon
(74) *Attorney, Agent, or Firm* — Wilmer Cutler Pickering Hale and Dorr LLP

(57) ABSTRACT

A method for writing data in a data storage device includes: writing data to a physical memory location in a non-volatile memory; writing, for a first time, to a location in a volatile memory corresponding to a logical address of the data, a physical address of the physical memory location of the non-volatile memory containing the data; and writing, for a second time, to the location in the volatile memory corresponding to the logical address of the data, the address of the physical memory location of the non-volatile memory containing the data. The physical address of the physical memory location is written with appended error detection code information, and the error detection code information is determined based on the logical address of the data.

15 Claims, 7 Drawing Sheets

(56) References Cited

U.S. PATENT DOCUMENTS

| | | | |
|---|---|---|---|
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |
| 8,166,245 B2 | 4/2012 | Diggs et al. | |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,341,339 B1 | 12/2012 | Boyle et al. | |
| 8,375,151 B1 | 2/2013 | Kan | |
| 8,392,635 B2 | 3/2013 | Booth et al. | |
| 8,397,107 B1 * | 3/2013 | Syu | G06F 11/1012 711/154 |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,549,236 B2 | 10/2013 | Diggs et al. | |
| 8,578,242 B1 * | 11/2013 | Burton | G06F 11/1004 714/763 |
| 8,583,835 B1 | 11/2013 | Kan | |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,985 B1 | 4/2014 | Boyle et al. | |
| 8,707,104 B1 | 4/2014 | Jean | |
| 8,713,066 B1 | 4/2014 | Lo et al. | |
| 8,713,357 B1 | 4/2014 | Jean et al. | |
| 8,719,531 B2 | 5/2014 | Strange et al. | |
| 8,724,422 B1 | 5/2014 | Agness et al. | |
| 8,725,931 B1 | 5/2014 | Kang | |
| 8,745,277 B2 | 6/2014 | Kan | |
| 8,751,728 B1 | 6/2014 | Syu et al. | |
| 8,769,190 B1 | 7/2014 | Syu et al. | |
| 8,769,232 B2 | 7/2014 | Suryabudi et al. | |
| 8,775,720 B1 | 7/2014 | Meyer et al. | |
| 8,782,327 B1 | 7/2014 | Kang et al. | |
| 8,788,778 B1 | 7/2014 | Boyle | |
| 8,788,779 B1 | 7/2014 | Horn | |
| 8,788,880 B1 | 7/2014 | Gosla et al. | |
| 8,793,429 B1 | 7/2014 | Call et al. | |
| 2010/0131723 A1 * | 5/2010 | Yorimitsu | G06F 3/0626 711/154 |
| 2010/0174849 A1 | 7/2010 | Walston et al. | |
| 2010/0250793 A1 | 9/2010 | Syu | |
| 2011/0099323 A1 | 4/2011 | Syu | |
| 2011/0283049 A1 | 11/2011 | Kang et al. | |
| 2012/0260020 A1 | 10/2012 | Suryabudi et al. | |
| 2012/0278531 A1 | 11/2012 | Horn | |
| 2012/0284460 A1 | 11/2012 | Guda | |
| 2012/0324191 A1 | 12/2012 | Strange et al. | |
| 2013/0132638 A1 | 5/2013 | Horn et al. | |
| 2013/0145106 A1 | 6/2013 | Kan | |
| 2013/0290793 A1 | 10/2013 | Booth et al. | |
| 2014/0059405 A1 | 2/2014 | Syu et al. | |
| 2014/0101369 A1 | 4/2014 | Tomlin et al. | |
| 2014/0115427 A1 | 4/2014 | Lu | |
| 2014/0133220 A1 | 5/2014 | Danilak et al. | |
| 2014/0136753 A1 | 5/2014 | Tomlin et al. | |
| 2014/0149826 A1 | 5/2014 | Lu et al. | |
| 2014/0157078 A1 | 6/2014 | Danilak et al. | |
| 2014/0181432 A1 | 6/2014 | Horn | |
| 2014/0223255 A1 | 8/2014 | Lu et al. | |

* cited by examiner

DOUBLE WRITING MAP TABLE ENTRIES IN A DATA STORAGE SYSTEM TO GUARD AGAINST SILENT CORRUPTION

CROSS-REFERENCE TO RELATED APPLICATION(S)

This application claims the benefit of U.S. provisional application No. 61/943,780 filed Feb. 24, 2014, the disclosure of which is hereby incorporated in its entirety by reference.

BACKGROUND

1. Technical Field

Apparatuses and methods consistent with the present inventive concept relate to data storage systems, and more particularly to double writing of map table entries in a data storage system to avoid silent corruption.

2. Related Art

Any data storage device that uses address indirection relies on a map table to point to a physical location of a latest copy of data at various logical page (L-page) addresses. Thus, the map table serves an important function of maintaining a logical-to-physical correspondence of stored data. Map table entries may be stored in volatile memory such as dynamic random access memory (DRAM). However, map table entries are susceptible to silent corruption.

BRIEF DESCRIPTION OF THE DRAWINGS

Aspects and features of the present inventive concept will be more apparent by describing example embodiments with reference to the accompanying drawings, in which.

DETAILED DESCRIPTION

While certain embodiments are described, these embodiments are presented by way of example only, and are not intended to limit the scope of protection. The methods and systems described herein may be embodied in a variety of other forms. Furthermore, various omissions, substitutions, and changes in the form of the example methods and systems described herein may be made without departing from the scope of protection.

Overview

Example embodiments of the present inventive concept provide a method of guarding against silent corruption in a data storage system.

Figure 1:
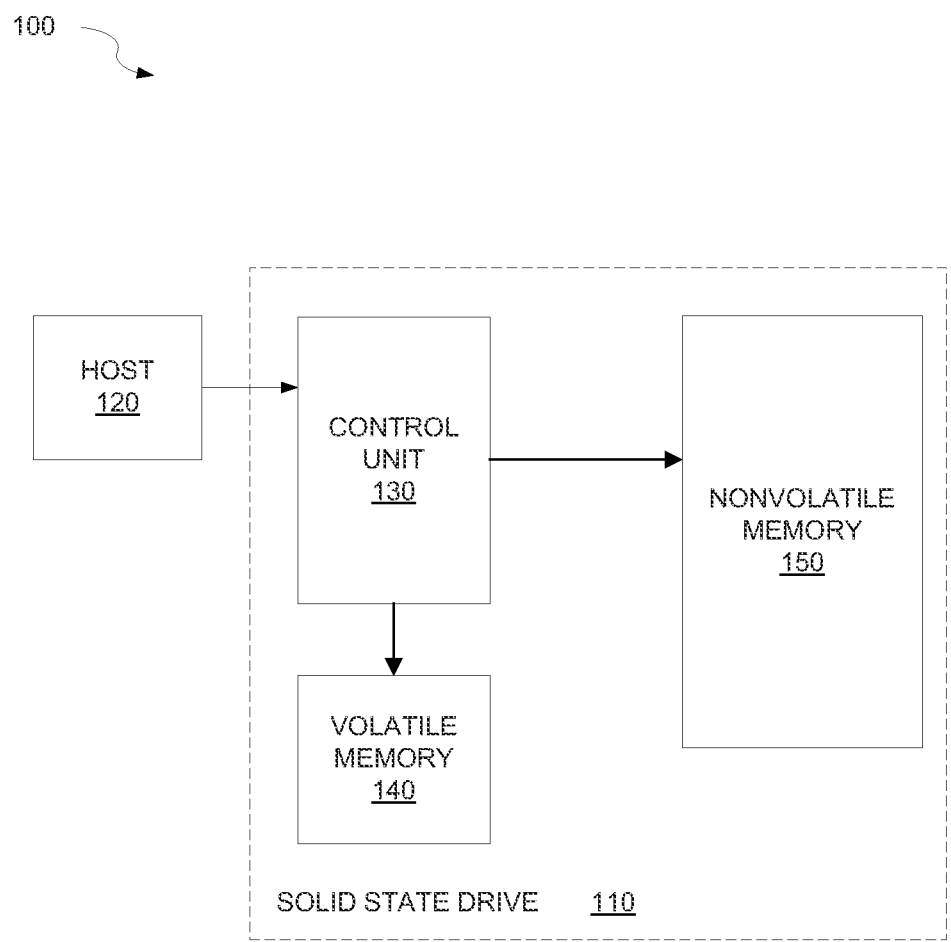
FIG. 1 is a block diagram illustrating a data storage system according to an example embodiment of the present inventive concept.

FIG. 1 is a block diagram illustrating a data storage system according to an example embodiment of the present inventive concept. The data storage system 100 may include a host 120 and a data storage device (DSD) such as a solid-state drive (SSD) 110. The SSD 110 may include a control unit 130, a volatile memory 140, for example, but not limited to, a plurality of dynamic random access memory (DRAM) devices or other volatile memory, and a non-volatile memory 150, for example, but not limited to, a non-volatile semiconductor memory (NVSM). The NVSM may be, for example, but not limited to, NAND flash memory devices, NOR flash memory devices, or other NVSM memory devices. The host 120 may issue data read and write commands to the SSD 110. The volatile memory 140 may store a map table. A DSD is generally a device that electronically stores data, so in other embodiments, the DSD may additionally include other types of memory such as rotational magnetic media (e.g., a solid-state hybrid drive (SSHD)).

Figure 2:
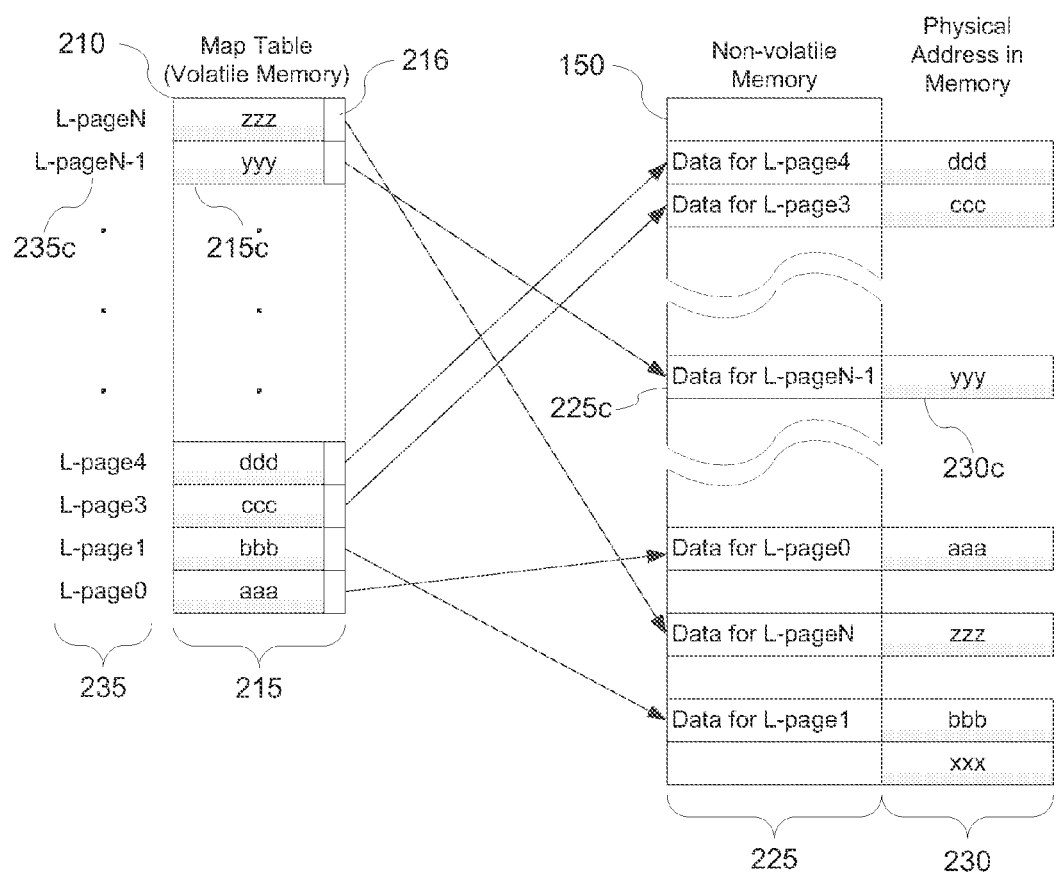
FIG. 2 is a diagram illustrating a relationship between a map table and a physical memory.

FIG. 2 is a diagram illustrating a relationship between a map table and a non-volatile physical memory. As illustrated in FIGS. 1 and 2, the map table 210 may be arranged in the volatile memory 140 with memory locations 215 assigned according to a consecutive order (e.g., according to L-page address) and each memory location 215 may contain an entry of a physical address 230 of a physical memory location 225 in non-volatile memory 150 that holds data corresponding to a logical address of the data (L-page) 235. The entries in the memory locations 215 in the map table 210 may be indexed at least in part according to the L-page 235. Referring to FIG. 2, data corresponding to L-page0 may be stored at a physical memory location 225 in the non-volatile memory 150 having a physical address 230 aaa, data corresponding to L-page1 may be stored at a physical memory location 225 in the non-volatile memory 150 having a physical address 230 address bbb, etc. Thus, the map table 210 acts as a set of pointers to the physical memory locations 225 of L-page data in the non-volatile memory 150. Each time L-page data is updated, the new data will be written to a new physical memory location 225 in the non-volatile memory 150. Accordingly, the entries in the memory locations 215 in the map table 210 for the updated L-page data must also be updated to refer to the physical addresses 230 of the new physical memory locations 225 of the data in the non-volatile memory 150.

Figure 3:
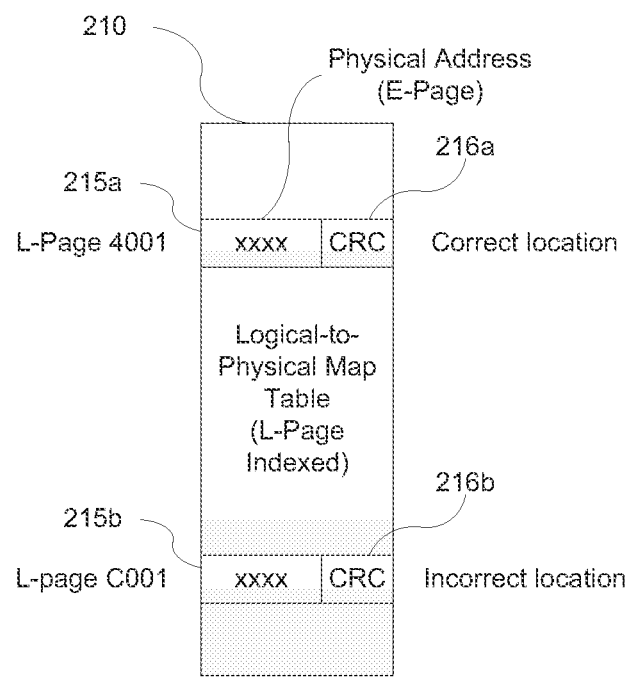
FIG. 3 is a diagram illustrating an occurrence of silent corruption in a map table.

FIG. 3 is a diagram illustrating an occurrence of silent corruption in a map table. Silent corruption occurs when an update to the map table 210 is written to the wrong map table entry. Referring to FIGS. 1, 2, and 3, an example scenario is described which involves a new write to L-page address 4001. In this example, the entry in the memory location 215a (i.e., the E-page location) in the map table 210 in the volatile memory 140 corresponding to data for L-page 4001 should have been updated. However, the update was erroneously written to the map table entry in the memory location 215b corresponding to L-page C001 in the L-page indexed map table 210. This could be caused by a bit flip in the L-page address 4001 to C0001. Hence, the map table entry in the memory location 215a corresponding to L-page 4001 points to stale data stored at the old physical address in the non-volatile memory 150. This is an undetectable problem because on the next request for L-page 4001 by the host 120, no mechanism exists to determine that the map table entry in the memory location 215b corresponding to L-page 4001 is stale.

In the map table 210, the entry in the memory location 215 of the physical address 230 for the physical memory location 225 in the non-volatile memory 150 is written with error detection code information 216, for example, but not limited to, cyclic redundancy code (CRC), a hash value, etc., appended to the entry. The error detection code information 216 is determined based at least in part on the L-page address 235 of the data stored at the physical memory location 225 in the non-volatile memory 150. However, a check of the error detection code information 216a in the map table entry in the memory location 215a corresponding to the stale data at L-page 4001 will evaluate correctly since the error detection code information 216a is seeded with the value of L-page 4001. Accordingly, the stale data will be passed to the host 120 undetected. The undetectable the stale data problem is termed "silent corruption" of data. Note that, however, the error detection code information 216b is effective in triggering an error condition, since error detection code information 216b is generated based on L-page 4001, but it is written in the entry for L-page C001 which will generate a mismatch.

Double Writing Map Table Entries

Some embodiments of the present inventive concept provide a double writing procedure to write each map table update twice to guard against the undetectable problem of silent corruption where an update to an entry is erroneously written to an incorrect location leaving the intended location pointing to stale data.

As discussed above, when data corresponding to an L-page 235 is updated, the updated data is written to a different physical memory location 225 in non-volatile memory 150 than the original data. The updated data may be data received from a host 120 or may be data read from a physical address 230 of a physical memory location 225 in the non-volatile memory 150, for example during garbage collection. In either case, the new physical address 230 corresponding to the updated data at the L-page 235 should be written to the map table 210. In one embodiment, this is performed at least twice. First, the new physical address 230 is written to the map table entry in the memory location 215 corresponding to the L-page 235 for the data that was updated. Then, the same new physical address 230 is written a second time to the same map table entry in the memory location 215.

By writing twice, the chance of silent corruption is reduced. Given that the probability of writing an update to the wrong location in the map table is 1/P, the probability of writing an update to the wrong location twice becomes $1/P \times 1/P = 1/P^2$.

If both update attempts write to the same correct L-page indexed location of the map table 210 no problem is caused and a subsequent read at that L-page 235 would return the correct data.

Figure 4:
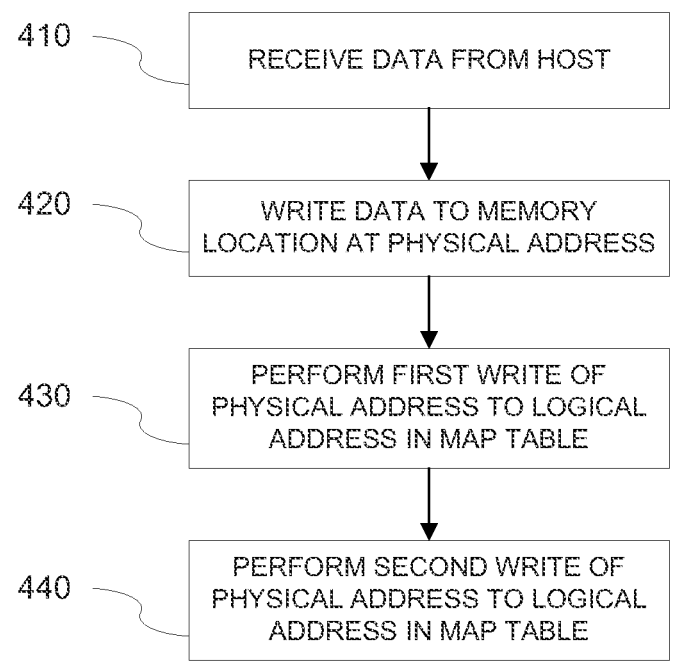
FIG. 4 is a flowchart illustrating a method for writing data in a storage device according to an example embodiment of the present inventive concept.

FIG. 4 is a flowchart illustrating a method for writing data in a storage device according to an example embodiment of the present inventive concept. Referring to FIGS. 1, 2, and 4, the control unit 130 may be configured to receive data for an L-page 235c from a host 120 (410), and write the data to a physical memory location 225c at a physical address yyy 230c in the non-volatile memory 150 (420).

The control unit 130 may be configured to write for a first time the physical address yyy 230c of the physical memory location 225c containing the data corresponding to the L-page 235c to the entry in the memory location 215c in the map table 210 corresponding to the L-page 235c (430). The control unit 130 may be further configured to write for a second time the physical address yyy 230c to the entry in the memory location 215c, thereby reducing the chance of silent corruption.

Figure 5:
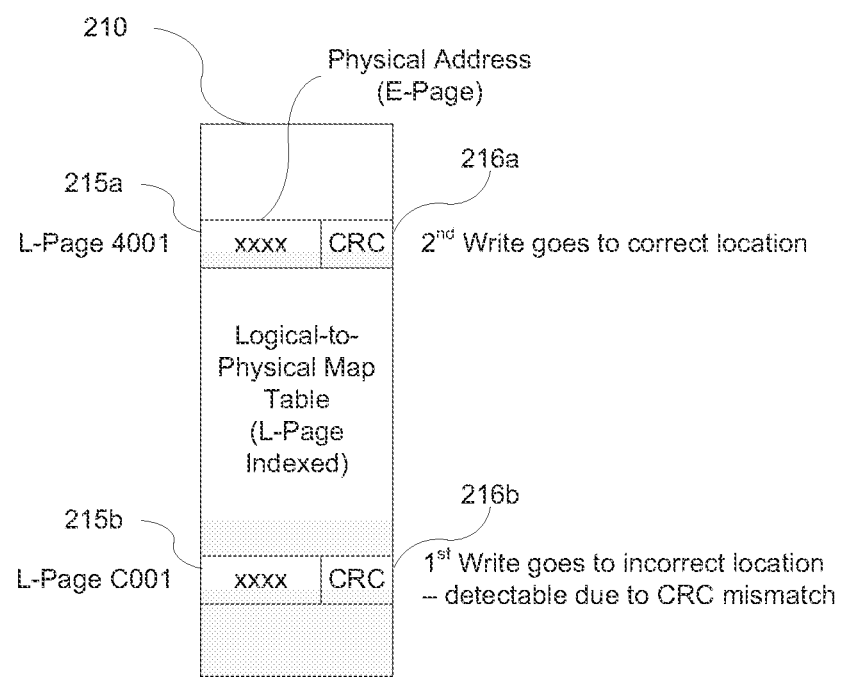
FIG. 5 is a diagram illustrating detection of a map table error according to an example embodiment of the present inventive concept.

FIG. 5 is a diagram illustrating detection of a map table error according to an example embodiment of the present inventive concept. As illustrated in FIG. 5, if one update attempt writes to the incorrect entry in the memory location 215b in the map table 210 but the second update attempt writes to the correct entry in the memory location 215a in the map table 210, the intended entry in the memory location 215a in the map table 210 will have been correctly updated. The update to the incorrect entry in the memory location 215b in the map table 210 is detectable by the error detection code 216b, for example, a CRC mismatch due to the fact that the CRC is L-page value seeded, and an error will be reported when the incorrectly updated entry in the memory location 215b in the map table 210 is subsequently read.

Thus, example embodiments of the present inventive concept reduce the probability of map table errors resulting from update errors, and mitigate the undetectable silent corruption problem.

Figure 6:
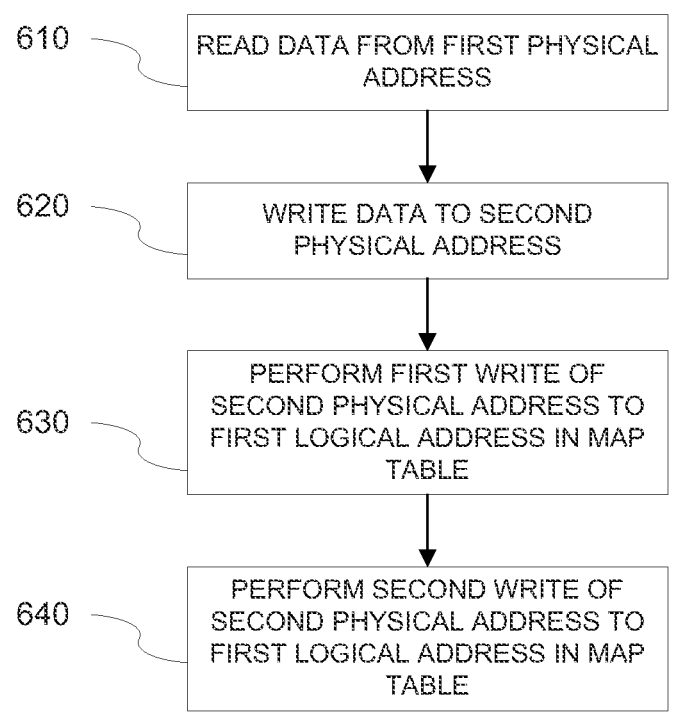
FIG. 6 is a flow chart illustrating a method for writing data in a storage device after a memory read according to an example embodiment of the present inventive concept and FIGS. 7A and 7B are diagrams illustrating a relationship between a map table and a physical memory a method for writing data in a storage device after a memory read according to an example embodiment of the present inventive concept.
Figures 7A, 7B:
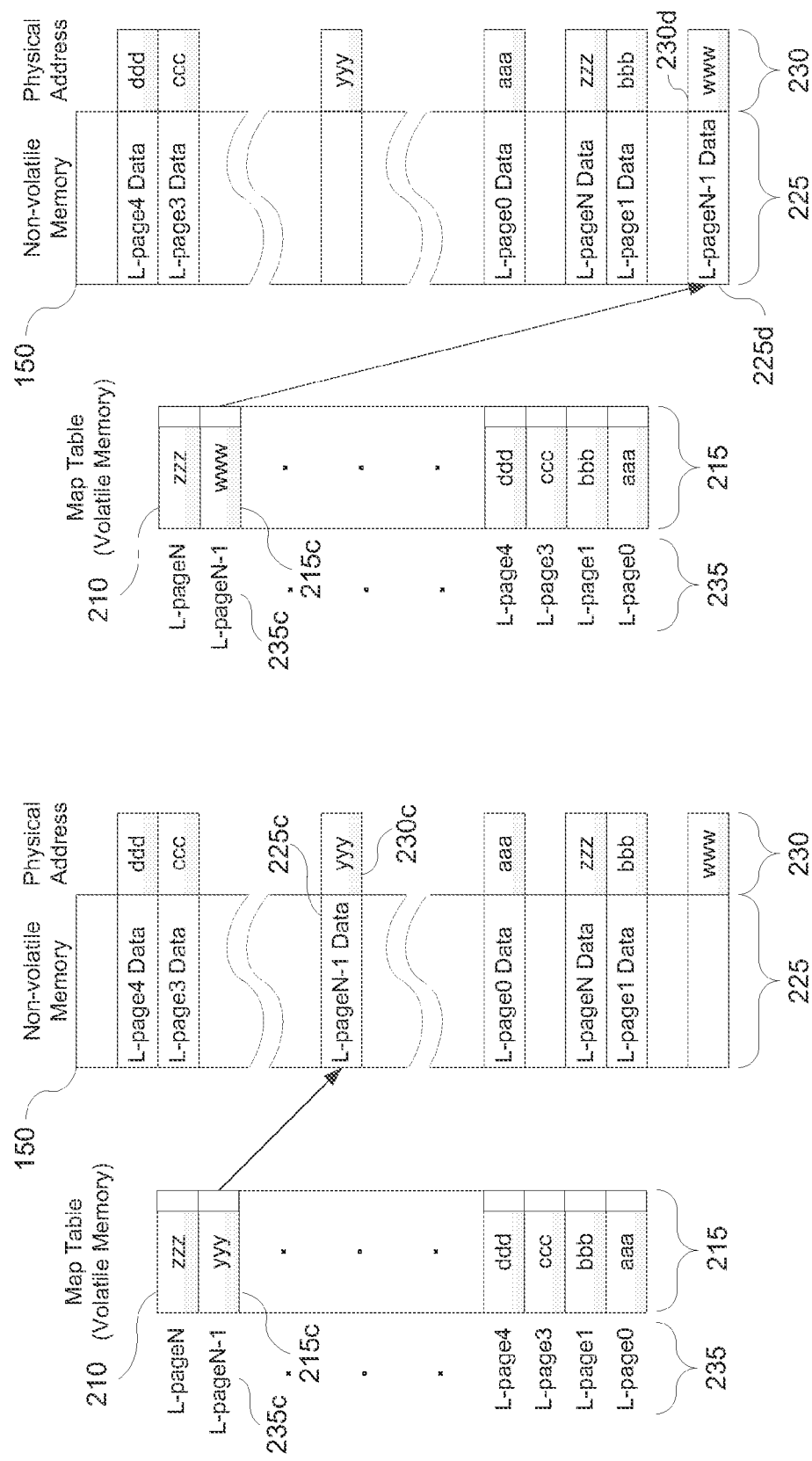

FIG. 6 is a flow chart illustrating a method for writing data in a storage device after a memory read according to an example embodiment of the present inventive concept. FIGS. 7A and 7B are diagrams illustrating a relationship between a map table and a physical memory a method for writing data in a storage device after a memory read according to an example embodiment of the present inventive concept.

Referring to FIGS. 1, 6, 7A, and 7B, the control unit 130 may be configured to read data corresponding to an L-page 235c from a first physical location 225c at a first physical address yyy 230c in the non-volatile memory 150 (610), and to subsequently write the data corresponding to the L-page 235c to a second physical memory location 225d at a second physical address www 230d in the non-volatile memory 150 (620). The control unit 130 may be further configured to modify the data that was read before subsequently writing the data to the second physical memory location 225d.

The control unit 130 may be configured to write for a first time the second physical address www 230d of the second physical memory location 225d containing the subsequently written data corresponding to the L-page 235c to the entry in the memory location 215c (630). The control unit 130 may be further configured to write for a second time the second physical address www 230d to the entry in the memory location 215c (640), thereby reducing the chance of silent corruption.

While certain embodiments have been described, these embodiments have been presented by way of example only, and are not intended to limit the scope of the protection. The methods and systems described herein may be embodied in a variety of other forms. Various omissions, substitutions, and/or changes in the form of the example methods and systems described herein may be made without departing from the spirit of the protection.

The example embodiments disclosed herein can be applied to solid state drives, hybrid hard drives, and the like. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. In addition, other forms of storage, for example, but not limited to, DRAM or SRAM, battery backed-up volatile DRAM or SRAM devices, EPROM, EEPROM memory, etc., may additionally or alternatively be used. As another example, various components illustrated in the figures may be implemented as software and/or firmware on a processor, ASIC/FPGA, or dedicated hardware. Also, the features and attributes of the specific example embodiments disclosed above may be combined in different ways to form additional embodiments, all of which fall within the scope of the present disclosure.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A method for writing data in a data storage device using a control unit, the method comprising:
    writing, by the control unit, data to a physical memory location in a non-volatile memory;
    sending, by the control unit, a first update request corresponding to the data to write a physical address of the physical memory location to a location in a volatile memory corresponding to a logical address of the data; and
    sending, by the control unit, a second update request corresponding to the data to write the physical address of the physical memory location to the location in the volatile memory corresponding to the logical address of the data, thereby reducing a probability of writing the physical address of the physical memory location to a wrong location in the volatile memory;
    wherein the physical address of the physical memory location is written with appended error detection code information, and
    the error detection code information is determined based on the logical address of the data.

2. The method of claim 1, wherein the location in the volatile memory comprises at least a portion of a map table.

3. The method of claim 2, wherein the map table is arranged with memory locations assigned according to a consecutive order.

4. The method of claim 1, wherein the data is received from a host.

5. The method of claim 1, wherein the data is read from another physical address of the non-volatile memory prior to writing the data to the physical memory location.

6. The method of claim 5, further comprising modifying the data read from the other physical address of the non-volatile memory before writing the data.

7. A data storage device, comprising:
    a non-volatile memory;
    a volatile memory;
    a control unit configured to:
        write data to a physical memory location in the non-volatile memory;
        send a first update request corresponding to the data to write a physical address of the physical memory location to a location in a volatile memory corresponding to a logical address of the data; and
        send a second update request corresponding to the data to write the physical address of the physical memory location to the location in the volatile memory corresponding to the logical address of the data, thereby reducing a probability of writing the physical address of the physical memory location to a wrong location in the volatile memory,
    wherein the address of the physical memory location is written with appended error detection code information, and
    the error detection code information is determined based on the logical address of the data.

8. The data storage device of claim 7, wherein the volatile memory comprises a map table.

9. The data storage device of claim 8, wherein the map table is arranged with memory locations assigned according to a consecutive order.

10. The data storage device of claim 7, wherein the volatile memory is dynamic random access memory (DRAM).

11. The data storage device of claim 7, wherein the non-volatile memory is a non-volatile semiconductor memory (NVSM).

12. The data storage device of claim 11, wherein the NVSM comprises NAND flash memory devices.

13. The data storage device of claim 7, wherein the data is received from a host.

14. The data storage device of claim 7, wherein the data is read from another physical address of the non-volatile memory prior to writing the data to the physical memory location.

15. The data storage device of claim 14, wherein the control unit is further configured to modify the data read from the other physical address of the non-volatile memory before writing the data.

* * * * *